United States Patent
Domadia et al.

[11] Patent Number: 5,949,137
[45] Date of Patent: Sep. 7, 1999

[54] STIFFENER RING AND HEAT SPREADER FOR USE WITH FLIP CHIP PACKAGING ASSEMBLIES

[75] Inventors: Ashok Domadia; Manickam Thavarajah, both of San Jose, Calif.

[73] Assignee: LSI Logic Corporation, Milpitas, Calif.

[21] Appl. No.: 08/938,100

[22] Filed: Sep. 26, 1997

[51] Int. Cl.$^6$ .............................. H05K 7/10; H01L 23/34; H01L 23/28

[52] U.S. Cl. .......................... 257/712; 257/213; 257/797; 257/718; 257/726; 257/727; 257/704; 257/783; 257/785; 361/764; 29/832; 29/840

[58] Field of Search ..................................... 257/712, 737, 257/713, 738, 707, 706, 717, 676, 720, 718, 675, 796, 798, 783, 785, 704, 719, 726, 727, 700, 797; 29/832, 840; 361/764

[56] References Cited

U.S. PATENT DOCUMENTS

| | | | |
|---|---|---|---|
| 5,046,552 | 9/1991 | Tousignant | 257/714 |
| 5,225,710 | 7/1993 | Westerkamp | 257/713 |
| 5,289,337 | 2/1994 | Aghazadeh et al. | 257/712 |
| 5,349,236 | 9/1994 | Oshino et al. | 257/727 |
| 5,377,078 | 12/1994 | Kalis | 257/719 |
| 5,523,620 | 6/1996 | Eytcheson et al. | 257/723 |
| 5,528,462 | 6/1996 | Pendse | 257/778 |
| 5,585,671 | 12/1996 | Nagesh et al. | 257/697 |
| 5,640,303 | 6/1997 | Hooley | 257/714 |
| 5,736,785 | 4/1998 | Chiang et al. | 257/712 |
| 5,745,344 | 4/1998 | Baska et al. | 257/713 |
| 5,789,812 | 8/1998 | Takahashi | 257/730 |
| 5,805,418 | 9/1998 | Salmonson et al. | 257/718 |

*Primary Examiner*—Alexander Oscar Williams
*Attorney, Agent, or Firm*—Beyer & Weaver, LLP

[57] ABSTRACT

A stiffener device for use with a flip chip packaging assembly including a generally rectangular, plate-like member having a substantially uniform thickness. At each of the rectangular plate-like member is a curved chamfer portion extending from an upper surface to a lower surface thereof, and defined by a chamfer edge commencing at one side edge forming the respective corner and terminating at an opposite side edge of the respective corner. Each curved chamfer portion is adapted to receptively accommodate a respective mounting bolt therethrough. The fabrication of the stiffener device is formed from a single stamping or punching operation in a manner maintaining a substantially planar upper surface and lower surface.

29 Claims, 5 Drawing Sheets

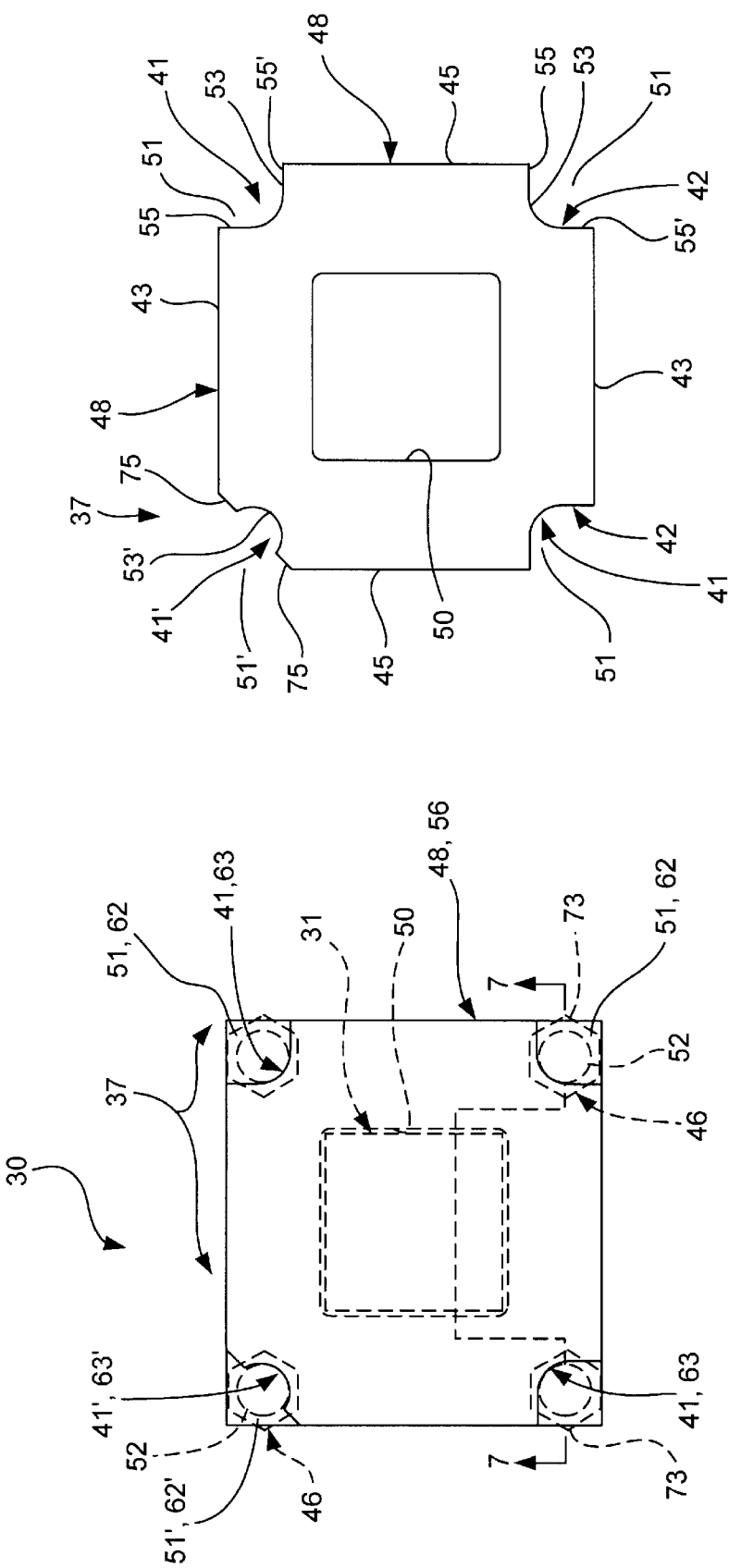

STIFFENER RING AND HEAT SPREADER FOR USE WITH FLIP CHIP PACKAGING ASSEMBLIES

TECHNICAL FIELD

This present invention relates, generally, to semiconductor flip-chip package assemblies, and, more particularly, relates to heat spreaders and substrate stiffeners for flip-chip semiconductor assemblies.

BACKGROUND ART

In semiconductor device assembly, a semiconductor chip (or "die") may be bonded directly to a packaging substrate, without the need for a separate leadframe or for separate I/O connectors (e.g. wire or tape). Such chips are formed with ball-shaped beads or bumps of solder affixed to their I/O bonding pads. During packaging, the chip is "flipped" onto its active circuit surface in a manner forming a direct electrical connection between the solder bumps of the chip and conductive traces on a packaging substrate. Semiconductor chips of this type are commonly referred to as "flip chips", and are advantageously of a comparatively reduced size. For example, in current flip chip designs, the semiconductor die may be dimensioned as small as about 0.5×0.5 inch whereas the unbonded solder bumps arranged of a surface thereof may have a diameter on the order of 4 to 5 mils.

Briefly and as shown in FIG. 1, a prior art flip chip packaging assembly 10 may be constructed using conventional fabrication techniques. This packaging assembly 10 includes a semiconductor die 11 which is electrically interconnected to a packaging substrate 12 through solder joints (not shown). The die 11 is then mechanically mounted to the substrate 12 employing a cured layer 13 of underfill epoxy. This fabrication process, thus, produces a mechanically, as well as electrically, bonded chip assembly.

Semiconductor packages are typically subject to regular temperature cycling throughout their operational lifetime due to power dissipation in the form of heat. In order to improve the thermal performance and reliability of the flip chip packages, a thin, substantially plate-like heat spreader 15, typically composed of a high thermal conductivity metal, may be bonded to an inactive upper surface 16 of chip 11. A conventional heat spreader 15, such as that shown in FIGS. 1 and 2, is typically composed of a piece of flat, rigid thermally conductive metal, such as nickel-plated copper, about 0.50–0.65 mm thick.

Moreover, to promote rigidity of the flip-chip packaging assembly 10 so that the substrate will not warp during various fabrication processes or during operation, a thin, substantially flat plate-like stiffener ring 17 (FIGS. 1 and 3) is positioned adjacent to and peripherally about the semiconductor flip-chip die 11. As shown in FIG. 3, plate-like stiffener ring 17, which is typically about 0.50–0.65 mm thick, includes a rectangular annulus 18 dimensioned for receipt of the flip chip die 11 therethrough.

To mechanically bond the stiffener ring 17 and the heat spreader 15 to the packaging substrate 12, a thin bond layer 20, 21 of thermally conductive adhesive or epoxy is applied between the stiffener ring 17 and the packaging substrate 12, and between the stiffener ring 17 and the heat spreader 15. This adhesive is typically a thermo-set epoxy, such as is available from Hysol Corporation of Industry, California (product numbers 4511 and 4527), Ablestik Laboratories of Rancho Domingo, Calif. and Johnson Matthey Electronics of San Diego, Calif. Together, the thin epoxy layers 20, 21, the stiffener ring 17 and the heat spreader 15 cooperate to provide sufficient rigidity to the flip chip packaging assembly 10, as well as provide sufficient heat dissipation.

Optimum heat dissipation and therefore thermal performance of the flip chip packaging assembly 10, however, is best achieved by minimizing the thickness of the thermal bond-lines (i.e., thin bond layer 20, 21). Heat transfer from the chip to the heat spreader and stiffener are thus facilitated. Too thick a thermo-set epoxy layer will substantially impede effective heat conduction between the bonded components. The thermal bond-line thickness (preferably between about 1 mil (0.0254 mm) to about 1½ mils (0.0381 mm)) obtained using the conventional apparatuses and methods described above is primarily dependent upon the flatness of both the chip, the heat spreader and the stiffener. Since these materials are both typically at least 0.50–0.65 mm thick, it is difficult to maintain their surfaces flat on a micron scale. These materials will typically warp from 25 to 50 microns ($\mu$m) across the area of a typical chip, 125.0 mm$^2$ Accordingly, considering the thickness of the stiffener ring 17 and the heat spreader 15 (i.e., about 0.50–0.65 mm), it is imperative that the opposed upper and lower planar surfaces 22, 23 and 24, 25 thereof be substantially flat. Any localized variations in the flatness of the planar surfaces on the order of more than about 3.2 mils (0.08 mm) may adversely affect the heat dissipation performance thereof. More importantly, such an uneven bond line thickness may cause delamination between adjacent bonded layers during component assembly or due to repeated operational thermal cycling. This delamination may then propagate throughout the entire layer should moisture become trapped therebetween.

Such flatness imperfections often originate at the stamping or punching operation employed to fabricate the metallic structure from a material web. For example, such metal movement often takes place at the corners 28 of the heat spreader 15 and the stiffener ring 17 due to the presence of respective mounting holes 26, 27 thereof (FIG. 4). Briefly, these mounting holes 26, 27, as shown at FIGS. 2 and 3, are formed and aligned for receipt of mounting posts (not shown) therethrough so that the flip-chip packaging assembly 10 may be clamped to a mounting surface.

Typically, problems result when the thickness between the mounting hole 26, 27 and the peripheral edges of these stamped components approach the thickness of the plate-like web material to be punched. Due to design criteria, it is desirable to position mounting holes 26 and 27 only about 0.70 mm from the peripheral edges, while the thickness of the stiffener ring 17 and the heat spreader 15 are preferably between about 0.50–0.65 mm thick. Accordingly, it is difficult to maintain the flatness of the upper and lower planar surfaces 22, 23 (FIG. 4) of these stamped devices within acceptable tolerances since subsequent stamping of the peripheral edges of these components often causes the portions near the mounting holes 26, 27 to cup out of plane. In fact, only about 20% of these fabricated components are within acceptable flatness tolerance, while about 80% of these components must be discarded. The cost of manufacture, thus, of the remaining acceptable components is substantially increased.

DISCLOSURE OF INVENTION

Accordingly, it is an object of the present invention to provide a flip chip packaging assembly with increased rigidity.

It is another object of the present invention to reduce delamination of the flip chip packaging assembly.

Another object of the present invention is to reduce irreparable metal movement of a stiffener ring and heat spreader of the flip chip packaging assembly during the punching operation for fabrication thereof.

Still another object of the present invention is to improve localized flatness of the edges of the stiffener ring and heat spreader.

Yet another object of the present invention is to improve manufacturing yield within the acceptable flatness tolerance of the stiffener ring and heat spreader of the flip chip packaging assembly.

It is still another object of the present invention to reduce the cost of manufacturing the stiffener ring and heat spreader.

In accordance with the foregoing objects, the present invention provides a stiffener device for use with a flip chip packaging assembly including a generally rectangular, plate-like member having a substantially uniform thickness defined by a substantially planar upper surface and an opposed substantially planar lower surface. At each corner of the rectangular plate-like member is a curved chamfer portion extending from the upper surface to the lower surface and defined by a chamfer edge commencing at one peripheral side edge forming the respective corner and terminating at an opposite peripheral side edge of the respective corner. Each curved chamfer portion is adapted to receptively accommodate a respective mounting bolt axially therethrough. Moreover, the fabrication of the stiffener device is formed from a single stamping or punching fabrication process in a manner maintaining substantially localized flatness at the corners thereof.

In another aspect of the present invention, a flip chip packaging assembly is provided including a flip chip device having an active circuit surface and an opposite inactive surface. This flip chip device is electrically coupled to a connection surface of a packaging substrate device. The packaging assembly further includes a stiffener device positioned in heat conductive proximity to the flip chip device which includes a substantially thin, plate-like member. This thin plate-like member is substantially uniform in thickness and is defined by a substantially planar upper surface and an opposed substantially planar lower surface. The plate-like member further includes a plurality of curved chamfer portions each defined by a respective chamfer edge which commences at a respective first peripheral side edge of the plate-like member and terminates at a respective second peripheral side edge. A substantially thin, thermally conductive adhesive layer is included in conductive contact with and positioned between the stiffener device and the packaging substrate to bond the stiffener to the packaging substrate.

The plate-like member is preferably provided by, in one aspect, a stiffener ring having an annulus extending from the upper surface to the lower surface thereof and formed for receipt of the flip chip device therethrough. The annulus is preferably substantially rectangular and generally conforms to the periphery of the flip chip device. Further, a heat spreader device is positioned atop the flip chip device in heat conductive contact with the inactive surface thereof in a manner dissipating heat generated by the operation of the flip chip device. Similar to the stiffener ring, the heat spreader device includes a substantially thin, plate-like component having a plurality of curved recess portions. Each recess portion is defined by a recess edge commencing at a respective first peripheral side edge of the plate-like component and terminating at a respective second peripheral side edge thereof. To bond the heat spreader device to the packaging substrate, a substantially thin, thermally conductive bond layer is provided in conductive contact with and positioned between the stiffener device and the heat spreader device.

BRIEF DESCRIPTION OF THE DRAWING

The assembly of the present invention has other objects and features of advantage which will be more readily apparent from the following description of the best mode of carrying out the invention and the appended claims, when taken in conjunction with the accompanying drawing, in which:

FIG. 5 is a top plan view of a flip-chip packaging assembly constructed in accordance with the present invention.

FIG. 6 is a top plan view of a stiffener ring device employed in the packaging assembly of FIG. 5.

BEST MODE OF CARRYING OUT THE INVENTION

Figure 1:
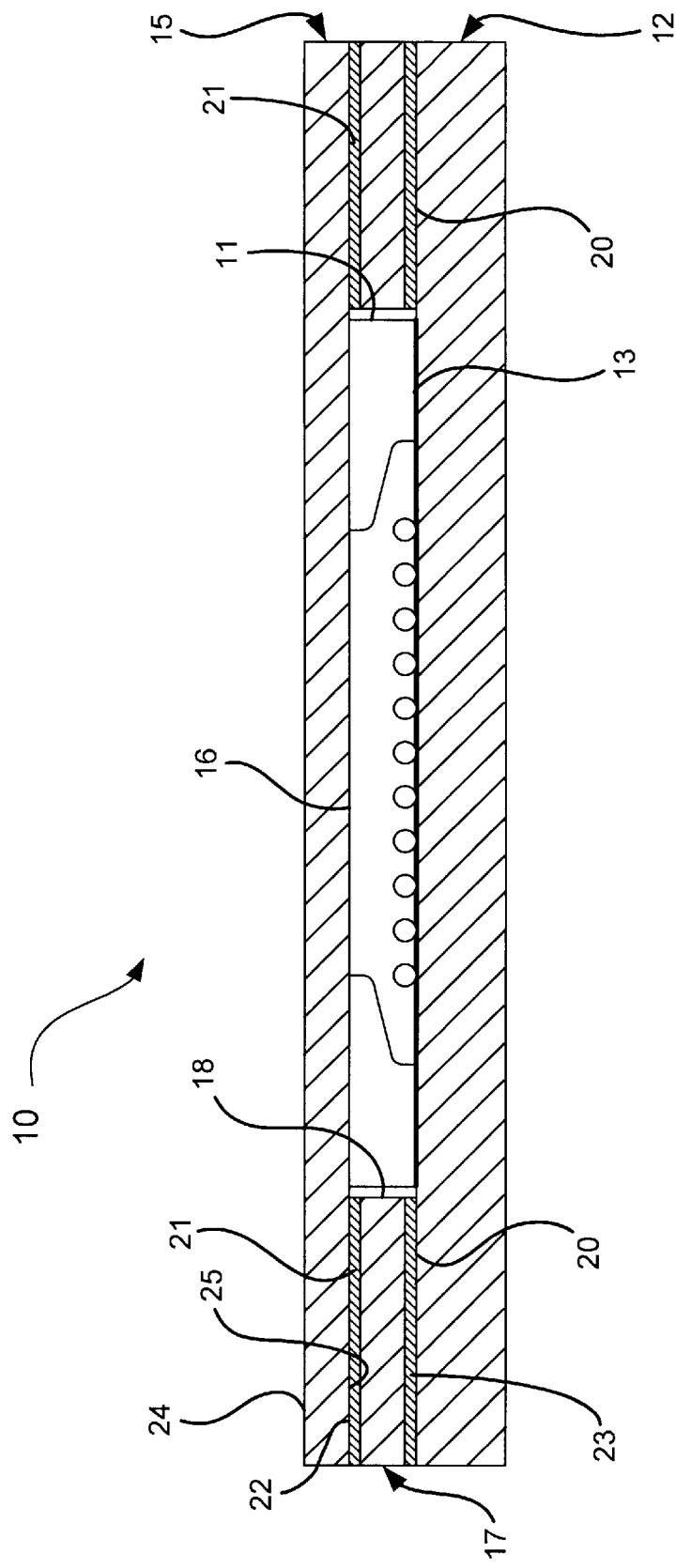
FIG. 1 is a side elevation view, in cross-section, of a prior art flip-chip packaging assembly incorporating a stiffener ring and a heat spreader.
Figure 2:
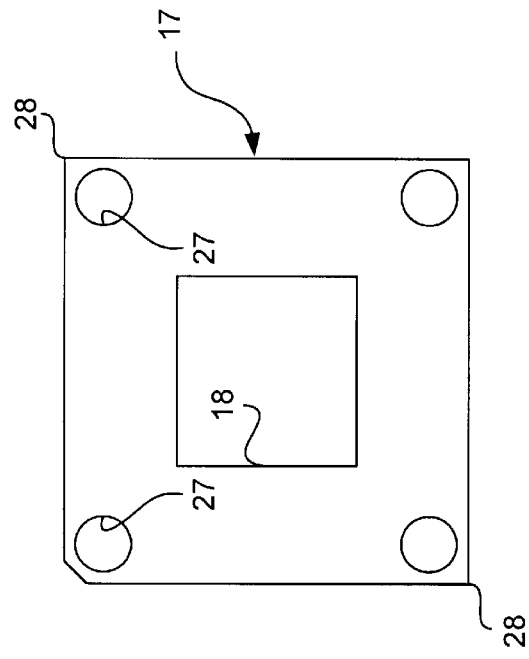
FIG. 2 is a reduced top plan view of a prior art heat spreader device employed in the packaging assembly of FIG. 1.
Figure 3:
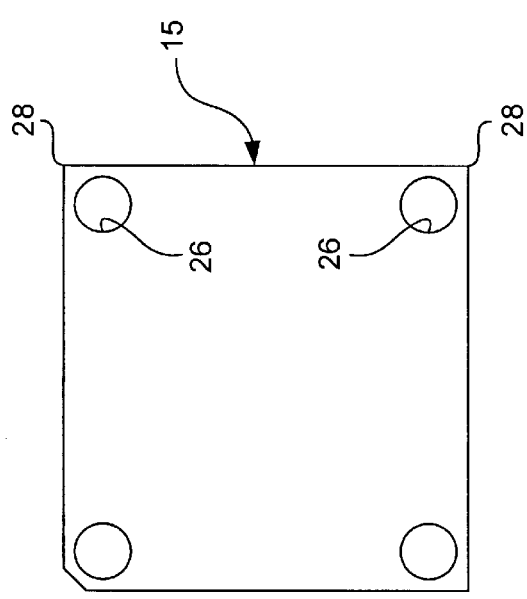
FIG. 3 is a reduced top plan view of a prior art stiffener ring device employed in the packaging assembly of FIG. 1.
Figure 4:
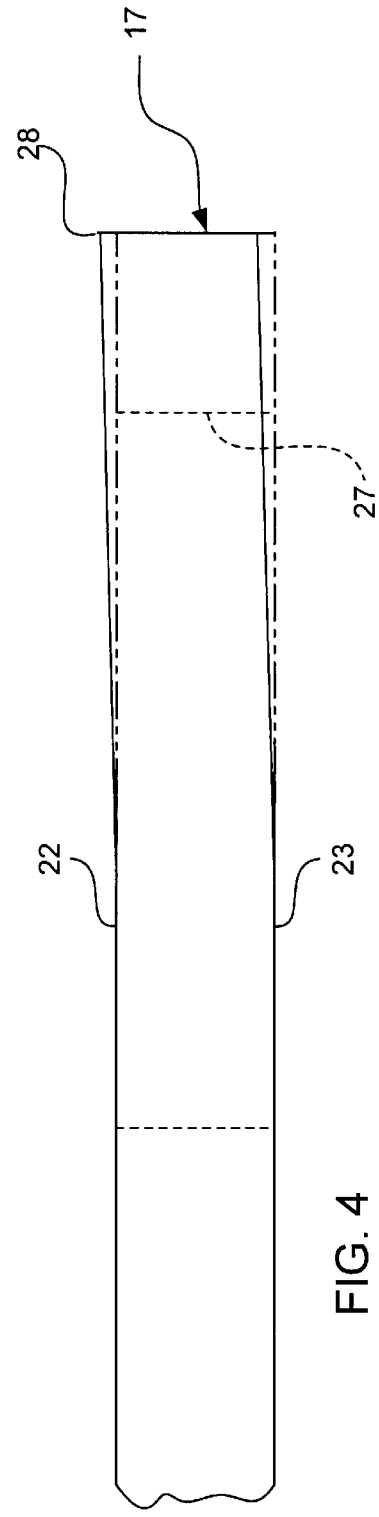
FIG. 4 is an enlarged, fragmentary, side elevation view of an edge of the heat spreader of FIG. 2 or the stiffener ring of FIG. 3 illustrating the cupping of the edge portion near the respective mounting holes.

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Figure 7:
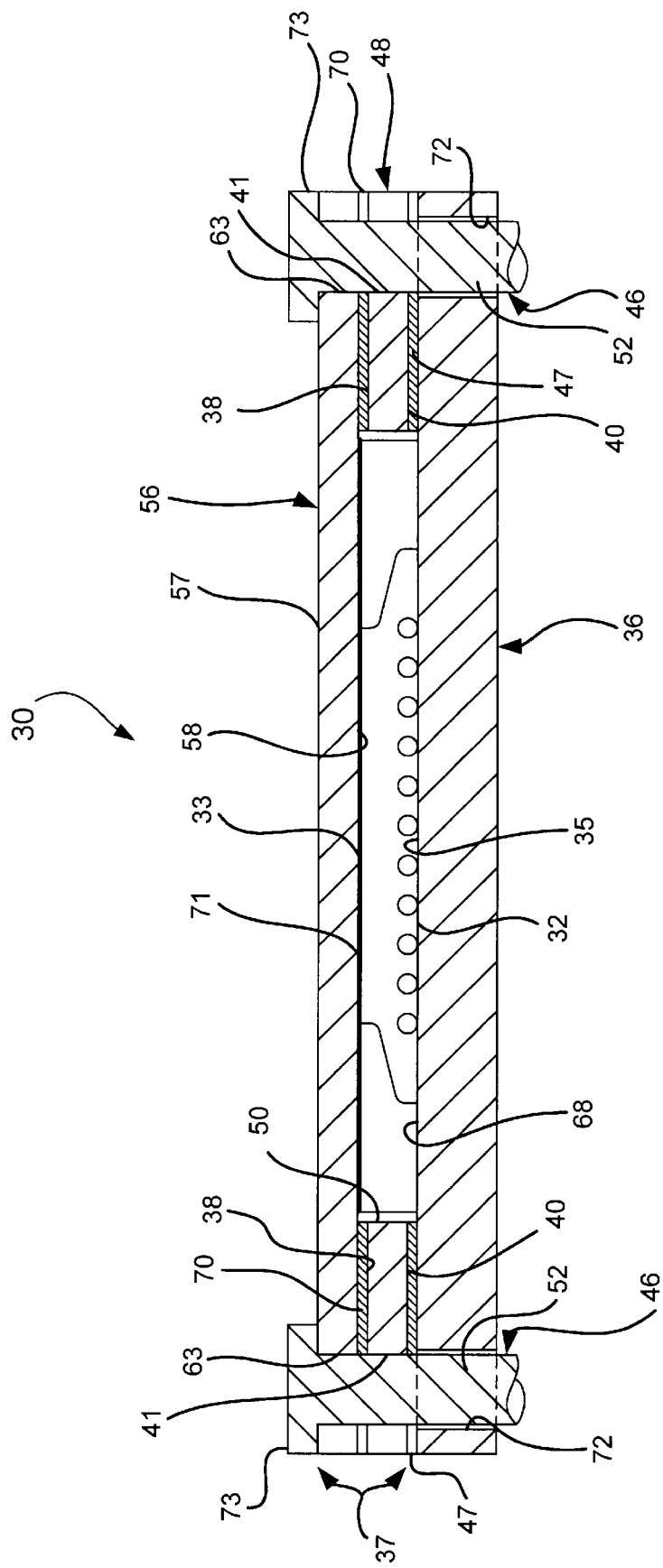
FIG. 7 is an enlarged side elevation view, in cross-section, of the flip-chip packaging assembly taken substantially along the plane of the line 7—7 in FIG. 5.

Attention is now directed to FIGS. 5–7 where a flip chip packaging assembly, generally designated 30, is provided including a flip chip device 31 having an active circuit surface 32 and an opposite inactive surface 33. This flip chip device 31 is electrically coupled to a connection surface 35 of a packaging substrate 36. The packaging assembly of the present invention further includes a stiffener device, generally designated 37, positioned in heat conductive proximity to the flip chip device 31. The stiffener device 37 is preferably provided by a substantially thin, plate-like member which is substantially uniform in thickness and is defined by a substantially planar upper surface 38 and an opposed substantially planar lower surface 40. The plate-like member further includes a plurality of curved chamfer portions, generally designated 41 (FIG. 6), each defined by a respective chamfer edge 42 which commences at a respective first peripheral side edge 43 of the plate-like member and terminates at a respective second peripheral side edge 45 thereof. Further, each curved chamfer portion 41 is adapted to receptively accommodate a respective clamping member 46 therethrough. A substantially thin, thermally conductive adhesive layer, generally designated 47, is included in conductive contact with and positioned between the stiffener device 37 and the packaging substrate 36 to bond the stiffener to the packaging substrate.

In accordance with the present invention, the chamfer portions 41 as well as the peripheral dimensions of the stiffener device 37 are simultaneously formed through a conventional stamping or punching operation. Since the chamfer portions have effectively replaced the prior art mounting holes as the axial receiving structure for the clamping members, the need for punched mounting holes in close proximity to the punched corners of the stiffener devices have been eliminated. More importantly, the inherent problem of metal movement or cupping at the corners, caused by the close proximity thereof to mounting holes, during the punching operation of the prior art stiffener design is also substantially eliminated. The localized flatness, hence, is more accurate and substantially more frequently within the acceptable flatness tolerance. For example, the percentage yield of the stamped stiffener devices within the acceptable flatness tolerance has dramatically increased from less than about 20% for the prior art technique to about 99% for the present invention. This significant increase, in turn, substantially reduces the cost per acceptable unit.

Referring now to FIGS. 6 and 7, the plate-like member of the stiffener device 37 is preferably provided by a stiffener ring 48 having an annulus 50 extending from the planar upper surface 38 to the planar lower surface 40 thereof. This annulus 50 is generally rectangular in dimension and is formed for receipt of the flip chip device 31 therethrough. More preferably, the annulus generally conforms to the square lateral perimetric in dimension of the flip chip device (FIG. 5).

Briefly, each corner 51 is defined by a substantially linear first peripheral side edge 43 and a substantially linear second peripheral side edge 45, oriented at 90° relative one another, and which intersect at a common point (i.e., corner 51). As above-indicated, the generally square stiffener ring 48 includes at each corner 51 a stamped chamfer portion 41 formed for positioning or receipt of a clamping member 46 (preferably a mounting bolt) axially therethrough. These smoothly curved chamfer portions 41 are sufficiently sized to receptively accommodate the shaft 52 of the mounting bolt 46 therein, while further being sufficiently large, relative the thickness of the stamped plate, to relieve stresses urged upon the corners during the punching operation. Preferably for a nickel-plated copper sheet metal of about 0.50–0.65 mm in thickness, the radius of curvature of the chamfer portion is at least about 1.0–3.0 mm, and more preferably about 2.0 mm.

Each chamfer edge 42 of chamfer portion 41 includes a central curved edge portion 53 integrally positioned between and flanked by a pair of substantially linear edge portions 55, 55'. Each linear edge portion 55, 55' terminates at the respective first and second peripheral side edges 43, 45 at an orientation substantially perpendicular therewith. It will be understood that these linear edge portions may intersect the respective first and second peripheral side edges 43, 45 at different angles without departing from the true spirit and nature of the present invention. Moreover, these chamfer portions may be punched into only one side edge thereof without departing from the true spirit and nature of the present invention. In this embodiment, the chamfer edge will commence and terminate along a common side edge.

Figure 8:
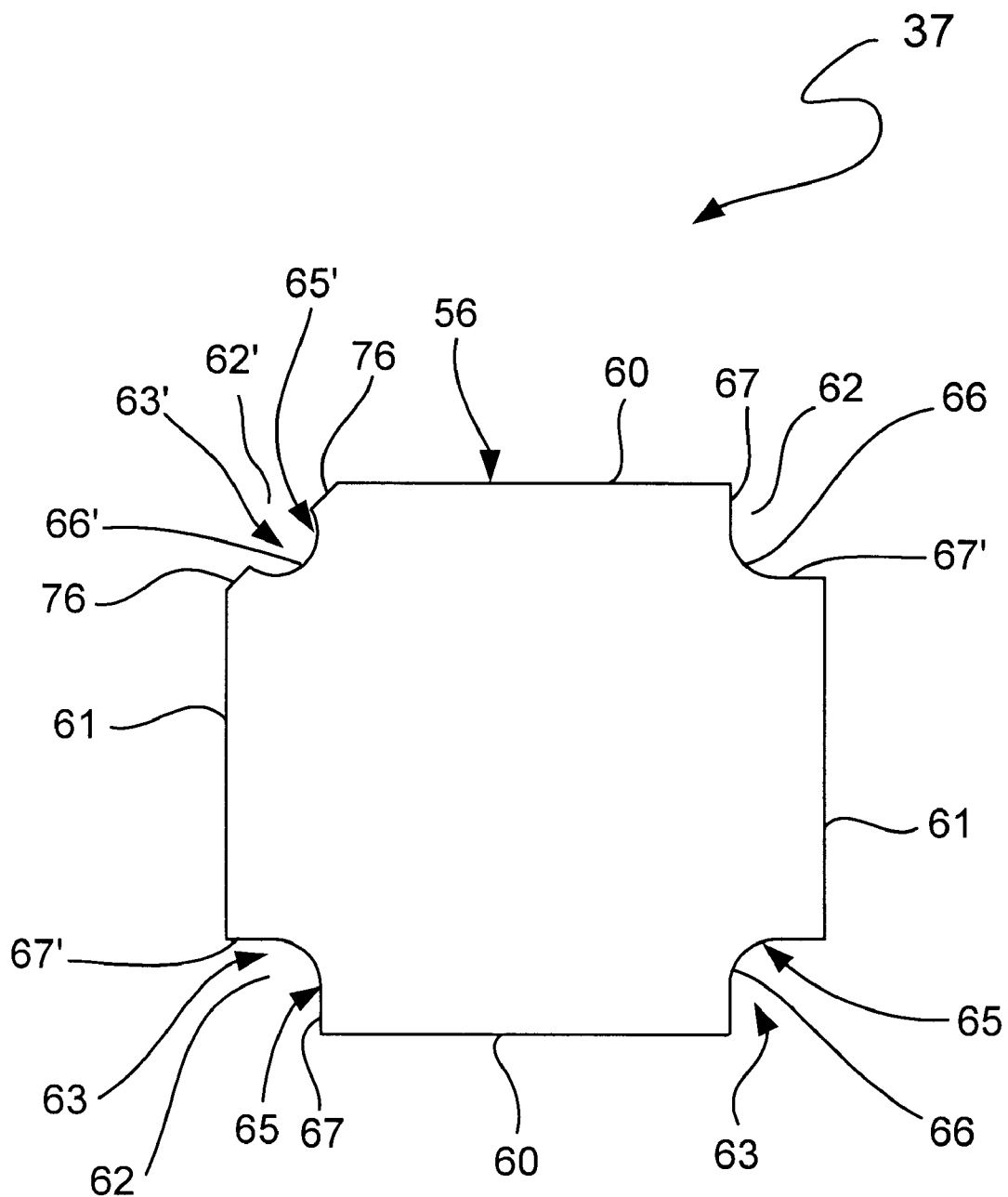
FIG. 8 is a top plan view of a heat spreader device employed in the packaging assembly of FIG. 5.

Similarly, as shown in FIGS. 5, 7 and 8, the plate-like member of the stiffener device 37 may also be preferably provided by a generally square dimensioned heat spreader 56. This member, primarily a heat dissipater, is also a substantially thin, uniformly thick component defined by a substantially planar upper surface 57 and an opposed substantially planar lower surface 58 (FIG. 7). The peripheral dimension is defined by a substantially linear first peripheral side edge 60 and a substantially linear second peripheral side edge 61 (FIG. 8). The adjacent side edges are oriented at substantially 90° relative one another, and intersect at a respective corner 62 thereof. At each corner 62 of the heat spreader 56 is a stamped recess portion 63 formed for positioning or receipt of the mounting bolt axially therethrough.

Again, similar to the stiffener ring 48, these smoothly curved recess portions 63 are sufficiently sized to receptively accommodate the shaft 52 of the mounting bolt 46 therein (FIGS. 5 and 7), while further being sufficiently large, relative the thickness of the stamped plate, to relieve stresses at the corners during the punching operation. Given the thickness of the nickel-plated copper sheet metal (i.e., about 0.50–0.65 mm thick), the radius of curvature of the recess portions 63 are at least about 1.0–3.0 mm, and more preferably about 2.0 mm.

Each recess portion 63, again, is defined by a recess edge 65 which includes a central curved edge portion 66 integrally positioned between and flanked by a pair of substantially linear edge portions 67, 67'. Each linear edge portion 67, 67' terminates at respective first and second peripheral side edges 60, 61 at an orientation substantially perpendicular therewith.

In accordance with the present invention, this stiffener device design enables the fabrication of both the stiffener ring 48 and the heat spreader 56 using a single punching operation in a more accurate manner. Localized flatness at the corners is thus more likely to be within the acceptable flatness tolerance (less than about 3.2 mils) since the stresses experienced in the punch operation of the prior art design have been eliminated. Hence, upon parallel mounting of the stiffener ring 48 and the heat spreader 56 to the packaging substrate 36 in the flip chip packaging assembly 30, the greater accuracy of the flatness at the respective corners results in substantially reduced delamination between the respective layers.

FIG. 7 best illustrates that a thermally conductive adhesive layer 47 is disposed between the lower surface 40 of the stiffener ring 48 and an upper surface 68 of the packaging substrate 36. Similarly, a thermally conductive bond layer 70 is disposed between the upper surface 38 of the stiffener ring 48 and the lower surface 58 of the heat spreader 56. Since the localized flatness of the corners can be maintained, the bond line thickness can be minimized for optimal thermal conductive efficiency. Preferably, the thickness of the bond layers are between about 0.08 mm to about 0.12 mm thick, and more preferably about 0.10 mm thick. The adhesive layer 47 and the bond layer 70 are further preferably provided by a thermo-set epoxy such as those described above.

Further, a thermal grease 71 is applied between the inactive surface 33 of the flip chip device 31 and the lower surface 58 of the heat spreader 56. This thermal grease facilitate conductive contact therebetween to optimize heat conduction.

Once the flip chip packaging assembly 30 has been assembled, the mounting bolts may be received axially through the respective axially aligned chamfer portions 41 and recess portions 63. As shown in FIGS. 5 and 7, the chamfer and recess portions enable receipt of mounting bolts 46 therethrough, which in turn, further extend through apertures 72 in the packaging substrate 36 for clamping thereto. The heads 73 of the mounting bolts 46 contact the upper surface 57 of the heat spreader for clamping of the packaging assembly 30. While only a portion of the head 73 contacts the heat spreader (FIG. 5), such partial contact is sufficient to securely mount the flip chip packaging assembly.

In the preferred form and as viewed in FIGS. 6 and 8, an identification marker 75, 76 is provided at one corner 51', 62', respectively, of both the stiffener ring 48 and the heat spreader 56. These markers 75, 76 facilitate pin 1 identification during installation on the mounting substrate, and are preferably provided by an additional 45° chamfer of the respective linear edge portions. The curved edge portions 53', 66', however, are substantially maintained at these identification corners 51', 62' for mounting receipt of the bolt 46.

What is claimed is:

1. A flip chip packaging assembly comprising:

a flip chip device having an active circuit surface and an opposite inactive surface;

a packaging substrate device having a connection surface electrically coupled to the active circuit surface of the flip chip device;

a stiffener device positioned in heat conductive proximity to said flip chip device, and including a substantially thin and substantially rigid, plate-like member having a substantially uniform thickness defined by a substantially planar upper surface and an opposed substantially planar lower surface, said plate-like member further including a plurality of curved chamfer portions each defined by a respective chamfer edge commencing at a respective first peripheral side edge of the plate-like member and terminating at a respective second peripheral side edge, each said curved chamfer portion being formed and dimensioned to receptively engage and accommodate a respective clamping member therethrough for engaged alignment thereof; and a substantially thin, thermally conductive adhesive layer in conductive contact with and positioned between the stiffener device and the packaging substrate to bond said stiffener to the packaging substrate.

2. The flip chip packaging assembly according to claim 1 wherein, said plate-like member is substantially rectangular such that each respective first peripheral side edge and second peripheral side edge are substantially linear and cooperate to define a respective corner portion thereof.

3. The flip chip packaging assembly according to claim 2 wherein, each said chamfer edge includes a central curved edge portion positioned between and integrally formed with a pair of substantially linear edge portions each terminating at an orientation substantially perpendicular to the respective first and second peripheral side edges defining the respective corner.

4. The flip chip packaging assembly according to claim 3 wherein, said plate-like member is about 0.45 mm to about 0.65 mm thick, and said adhesive layer is about 0.08 mm to about 0.12 mm thick.

5. The flip chip packaging assembly according to claim 4 wherein, said plate-like member is about 0.50 mm thick, and said adhesive layer is about 0.10 mm thick.

6. The flip chip packaging assembly according to claim 5 wherein, said adhesive layer is provided by a thermally conductive epoxy layer.

7. The flip chip packaging assembly according to claim 1 wherein, said stiffener device is provided by a heat spreader positioned atop said flip chip device in heat conductive contact with said inactive surface in a manner dissipating heat generated by the operation of said flip chip device.

8. The flip chip packaging assembly according to claim 7 wherein, said plate-like member is substantially rectangular such that each respective first peripheral side edge and second peripheral side edge are substantially linear and cooperate to define a respective corner portion thereof.

9. The flip chip packaging assembly according to claim 8 wherein, each said chamfer edge includes a central curved edge portion positioned between and integrally formed with a pair of substantially linear edge portions each terminating at an orientation substantially perpendicular to the respective first and second peripheral side edges defining the respective corner.

10. The flip chip packaging assembly according to claim 1 wherein, said plate-like member is provided by a stiffener ring having an annulus extending from the upper surface to the lower surface thereof and formed for receipt of the flip chip device therethrough.

11. The flip chip packaging assembly according to claim 10 wherein, said annulus is substantially rectangular and generally conforms to the periphery of the flip chip device.

12. The flip chip packaging assembly according to claim 10 further including:

a heat spreader device positioned atop said flip chip device in heat conductive contact with said inactive surface thereof in a manner dissipating heat generated by the operation of said flip chip device, said heat spreader device including a substantially thin and substantially rigid, plate-like component having a substantially uniform thickness defined by a substantially planar upper surface and an opposed substantially planar lower surface, said plate-like component further including a plurality of curved recess portions each defined by a recess edge commencing at a respective first peripheral side edge of the plate-like component and terminating at a respective second peripheral side edge thereof, each said curved recess portion being formed and dimensioned to receptively engage and accommodate the respective clamping member therethrough for engaged alignment thereof; and a substantially thin, thermally conductive bond layer in conductive contact with and positioned between the stiffener device and the heat spreader device to bond said heat spreader device to the packaging substrate.

13. The flip chip packaging assembly according to claim 12 wherein, said plate-like member of said stiffener device and said plate-like component of said heat spreader are substantially rectangular such that each respective first peripheral side edge and second peripheral side edge are substantially linear and cooperate to define a respective corner portion thereof.

14. The flip chip packaging assembly according to claim 13 wherein, each said chamfer edge of said stiffener ring and said recess edge of said heat spreader includes a central curved edge portion positioned between and integrally formed with a pair of substantially linear edge portions each terminating at an orientation substantially perpendicular to the respective first and second peripheral side edges defining the respective corner portions thereof.

15. The flip chip packaging assembly according to claim 14 wherein, said plate-like member is about 0.45 mm to about 0.65 mm thick, and said adhesive layer is about 0.08 mm to about 0.12 mm thick, and said plate-like component is about 0.45 mm to about 0.65 mm thick, and said bond layer is about 0.08 mm to about 0.12 mm thick.

16. The flip chip packaging assembly according to claim 15 wherein, said plate-like member is about 0.50 mm thick, and said adhesive layer is about 0.10 mm thick, and said plate-like component is about 0.50 mm thick, and said bond layer is about 0.10 mm thick.

17. The flip chip packaging assembly according to claim 13 wherein, said adhesive layer and said bond layer are provided by a thermally conductive epoxy layer.

18. The flip chip packaging assembly according to claim 13 further including:

a layer of thermal grease positioned in conductive contact between the lower surface of said heat spreader and the inactive surface of said flip chip device.

19. The flip chip packaging assembly according to claim 13 wherein, at least one corner of said plate-like member and said plate-like component includes an identification mark.

20. The flip chip packaging assembly according to claim 12 wherein, said clamping members are provided by mounting bolts extending substantially perpendicularly therethrough.

21. A stiffener device for use with a flip chip packaging assembly comprising:

a generally rectangular, substantially rigid plate-like member having a substantially uniform thickness defined by a substantially planar upper surface and an opposed substantially planar lower surface, said plate-like member further including at each corner thereof a curved chamfer portion extending from the upper surface to the lower surface and defined by a chamfer edge commencing at one side edge forming the respective corner and terminating at an opposite side edge of the respective corner thereof, each said curved chamfer portion being formed and dimensioned to receptively engage and accommodate a respective mounting bolt extending substantially perpendicularly therethrough for alignment and supportive retainment of plate-like member.

22. The stiffener device according to claim 21 wherein, said plate-like member is about 0.45 mm to about 0.65 mm thick.

23. The stiffener device according to claim 22 wherein, said plate-like member is about 0.50 mm thick.

24. The stiffener device according to claim 21 wherein, said plate-like member includes an annulus formed for receipt of a flip chip device therethrough.

25. The stiffener device according to claim 21 wherein, at least one corner of said plat-like member includes an alignment mark.

26. The stiffener device according to claim 21 wherein, each said chamfer edge includes a central curved edge portion positioned between and integrally formed with a pair of substantially linear edge portions each terminating at an orientation substantially perpendicular to the opposed respective side edges defining the respective corner.

27. The stiffener device according to claim 26 wherein, said plate-like member includes an annulus formed for receipt of a flip chip device therethrough.

28. The stiffener device according to claim 27 wherein, at least one corner of said plat-like member includes an identification mark.

29. The stiffener device according to claim 28 wherein, said plate-like member is about 0.45 mm to about 0.65 mm thick.

* * * * *